(12) United States Patent
Maes et al.

(10) Patent No.: US 7,927,933 B2
(45) Date of Patent: Apr. 19, 2011

(54) METHOD TO ENHANCE THE INITIATION OF FILM GROWTH

(75) Inventors: Jan Willem Maes, Wilrijk (BE); Annelies Delabie, Bierbeek (BE); Yashuhiro Shimamoto, Saitama (JP)

(73) Assignees: IMEC, Leuven (BE); ASM International, Bilthoven (NL); Renesas Technology Corporation, Tokyo (JP)

(*) Notice: Subject to any disclaimer, the term of this patent is extended or adjusted under 35 U.S.C. 154(b) by 893 days.

(21) Appl. No.: 11/060,105

(22) Filed: Feb. 16, 2005

(65) Prior Publication Data

US 2006/0180879 A1    Aug. 17, 2006

(51) Int. Cl.
*H01L 21/84* (2006.01)
*H01L 21/8238* (2006.01)
*H01L 21/4763* (2006.01)

(52) U.S. Cl. .......... 438/155; 438/199; 438/622
(58) Field of Classification Search .......... 438/155, 438/199, 622
See application file for complete search history.

(56) References Cited

U.S. PATENT DOCUMENTS

| | | | |
|---|---|---|---|
| 6,255,230 B1 * | 7/2001 | Ikakura et al. | 438/765 |
| 6,407,435 B1 * | 6/2002 | Ma et al. | 257/410 |
| 6,506,668 B1 | 1/2003 | Woo et al. | |
| 6,620,720 B1 | 9/2003 | Moyer et al. | |
| 6,642,573 B1 | 11/2003 | Halliyal et al. | |
| 6,727,590 B2 * | 4/2004 | Izumitani et al. | 257/758 |
| 6,875,681 B1 * | 4/2005 | Bohr | 438/612 |
| 7,071,066 B2 * | 7/2006 | Wang et al. | 438/301 |
| 7,307,346 B2 * | 12/2007 | Kaltalioglu et al. | 257/760 |
| 2002/0016084 A1 * | 2/2002 | Todd | 438/791 |
| 2002/0094698 A1 * | 7/2002 | Li et al. | 438/778 |
| 2002/0137274 A1 | 9/2002 | Lee et al. | |
| 2002/0192889 A1 * | 12/2002 | Akram et al. | 438/197 |
| 2003/0075756 A1 * | 4/2003 | Suzuki | 257/315 |
| 2003/0082296 A1 | 5/2003 | Elers et al. | |
| 2003/0129826 A1 | 7/2003 | Werkhoven et al. | |
| 2003/0199137 A1 | 10/2003 | Lee et al. | |
| 2003/0219993 A1 * | 11/2003 | Wu et al. | 438/761 |
| 2004/0067660 A1 | 4/2004 | Wilk et al. | |
| 2004/0203254 A1 | 10/2004 | Conly, Jr. et al. | |
| 2004/0248392 A1 * | 12/2004 | Narwankar et al. | 438/584 |

(Continued)

FOREIGN PATENT DOCUMENTS

WO    WO 02/43115    5/2002

OTHER PUBLICATIONS

International Search Report for Equivalent European Application 05447030.7, mailed on Aug. 24, 2005.

(Continued)

*Primary Examiner* — Matthew C Landau
*Assistant Examiner* — James M Mitchell
(74) *Attorney, Agent, or Firm* — Knobbe Martens Olson & Bear LLP

(57) ABSTRACT

The present invention relates generally to integrated circuit (IC) fabrication processes. The present invention relates more particularly to the treatment of surfaces, such as silicon dioxide or silicon oxynitride layers, for the subsequent deposition of a metal, metal oxide, metal nitride and/or metal carbide layer. The present invention further relates to a high-k gate obtainable by a method of the invention.

34 Claims, 5 Drawing Sheets

U.S. PATENT DOCUMENTS

| | | |
|---|---|---|
| 2005/0145177 A1* | 7/2005 | McSwiney et al. ... 118/723 MA |
| 2006/0051920 A1* | 3/2006 | Yamaguchi et al. .......... 438/257 |
| 2006/0125028 A1* | 6/2006 | Chen et al. .................... 257/410 |
| 2006/0128150 A1* | 6/2006 | Gandikota et al. ............ 438/681 |
| 2006/0141729 A1* | 6/2006 | Wang et al. ................... 438/366 |
| 2006/0182885 A1* | 8/2006 | Lei et al. ..................... 427/248.1 |
| 2006/0212471 A1* | 9/2006 | Lundberg et al. ............. 707/102 |

OTHER PUBLICATIONS

Koh et al. "Meeting the Cu diffusion barrier challenge using ALD tungsten nitride carbide" Solid State Technology, pp. 54-58, Jun. 2005.

Travaly et al. "Characterization of atomic layer deposited nanoscale structure on dense dielectric substrates by X-ray reflectivity" Microelectronic Engineering 82 (2005) pp. 639-644.

* cited by examiner

METHOD TO ENHANCE THE INITIATION OF FILM GROWTH

FIELD OF THE INVENTION

The present invention relates generally to integrated circuit (IC) fabrication processes.

The present invention relates more particularly to the treatment of surfaces, such as silicon dioxide or silicon oxynitride layers, for the subsequent deposition of a metal, metal oxide, metal nitride or metal carbide layer.

BACKGROUND OF THE INVENTION

Integrated circuit design is constantly being scaled down in pursuit of faster circuit operation and lower power consumption.

As semiconductor devices become smaller there is a need for higher dielectric constant (high-k) gate material.

Many high dielectric constant dielectric materials (high-k dielectric) have been investigated as possible replacements for silicon dioxide, which is the material of choice for the gate electrode. But one of the remaining problems is the deposition of the high-k materials on substrate surfaces for obtaining layer thickness compatible with the properties and applications sought.

WO02/43115 describes a method for treating substrate surfaces in preparation for subsequent nucleation-sensitive depositions and adsorption-driven deposition by means of non-depositing plasma products.

U.S. Pat. No. 6,620,720 describes a method for reducing the thermal budget in a semiconductor manufacturing process wherein the remote thermal nitridation step is replaced by a remote plasma nitridation step.

None of these methods allows the formation of a smooth, uniform and closed film (or layer) upon chemically stable substrate surfaces.

Indeed, up to the present invention, deposition of a high-k metal oxide on a chemically stable surface started slowly and through the local nucleation of three dimensional (higher than one monolayer) islands distributed all over the surface. Films closure took place only once the islands were big enough to grow together. Consequently, a certain minimum thickness of material had to be deposited before obtaining a closed film to be used for semiconductor applications (e.g. about 10 nm or more).

SUMMARY OF THE INVENTION

Although a method of the preferred embodiments is particularly suited for the deposition of high-k dielectric films, similar problems are encountered in the deposition of a metal, metal nitride, metal oxynitride or metal carbide film onto a chemically stable surface, for which a method of the preferred embodiments can also beneficially be used.

The preferred embodiments provide a method for enhancing the growth of a metal, metal oxide, metal nitride, metal oxynitride, and/or metal carbide layer comprising the step of depositing the metal, metal oxide, metal nitride, metal oxynitride and/or metal carbide layer upon a $Si_xN_y$ layer, wherein x and y are real numbers, wherein x is equal to about 3 or is higher than about 3, wherein y is higher than 0 and equal to or less than about 4, and wherein x and y may be equal or different. Preferably, $x \geq 3$ and $0 < y \leq 4$. Preferably, the ratio x/y is higher than about 0.75 and may vary with no upper limit.

The preferred embodiments are based on the surprising discovery that the growth inhibition of a metal, metal oxide, metal nitride, metal oxynitride or metal carbide film is strongly reduced or even completely eliminated when the film is grown upon a $Si_3N_4$-like layer.

A method according to the preferred embodiments allows enhancing the deposition of metal, metal oxide, metal nitride, metal oxynitride and/or metal carbide film(s) (or layers) upon the $Si_xN_y$ layer, obtaining high quality ultra thin films, in particular films with a thickness of less than 8 nm, preferably of less than (about) 5 nm, less than (about) 4 nm, or less than (about) 3 nm, and more preferably of less than (about) 2 nm.

A method of the preferred embodiments for enhancing the growth of a metal, metal oxide, metal nitride, metal oxynitride and/or metal carbide layer comprises the step of depositing the metal, metal oxide, metal nitride, metal oxynitride and/or metal carbide layer upon a $Si_xN_y$ layer, wherein x and y are real numbers, wherein x is equal to (about) 3 or is higher than (about) 3, wherein y is higher than 0 and equal to or less than (about) 4, and wherein x and y may be equal or different.

The metal, metal oxide, metal nitride, metal oxynitride and/or metal carbide can be deposited by a Physical Vapor Deposition (PVD) process (such as sputtering), by a Chemical Vapor Deposition (CVD) process, a Metal Organic CVD (MOCVD) process or an Atomic Layer Deposition (ALD) process.

In a method of the preferred embodiments, the high-k metal oxide can be selected from the group consisting of titanium oxide, tantalum oxide, aluminium oxide, zirconium oxide, lanthanum oxide, hafnium oxide, hafnium scandium oxide, hafnium silicon oxide, and any combination of two, three, four, five or six thereof.

The metal can be selected from the group consisting of tantalum, ruthenium, titanium, tungsten, aluminium, copper, Cobalt, nickel, molybdenum, and any combination of two, three, four, five, six or more thereof.

The metal nitride can be selected from the group consisting of tantalum nitride, titanium nitride, tungsten nitride, niobium nitride, molybdenum nitride, hafnium nitride, and any combination of two, three, four, five or six thereof.

In a method of the preferred embodiments, the metal oxynitride can be selected from the group consisting of titanium oxynitride, tantalum oxynitride, aluminium oxynitride, zirconium oxynitride, lanthanum oxynitride, hafnium oxynitride, hafnium scandium oxynitride, hafnium silicon oxynitride, and any combination of two, three, four, five or six thereof.

The metal carbide can be selected from the group consisting of tantalum carbide, titanium carbide, tungsten carbide, niobium carbide, molybdenum carbide, hafnium carbide, and any combination of two, three, four, five or six thereof. Further, any combination of a metal nitride and a metal carbide can be selected such a tungsten nitride carbide.

In a method of the preferred embodiments, the $Si_xN_y$ layer is deposited upon a metal growth inhibiting surface, such as thermal oxide layers, in particular thermal $SiO_2$ layer or thermal SiON layer, before the step of depositing the metal, metal oxide, metal nitride, metal oxynitride and/or metal carbide layer.

The $Si_xN_y$ layer can be deposited by means of a Chemical Vapor Deposition process, using precursors comprising at least one silane and ammonia ($NH_3$), or by means of RACVD, RPECVD or PECVD process, using precursors comprising at least one silane and nitrogen radicals and optionally ammonia ($NH_3$).

The at least one silane can be selected from the group consisting of monosilane, disilane, trisilane, monochlorosilane, dichlorosilane, trichlorosilane, and tetrachlorosilane.

Another aspect relates to a high-k gate obtainable by a method of the preferred embodiments.

a thermal SiON layer grown in NO atmosphere at 1000° C. (NO-RTO (Rapid Thermal Oxidation using Nitric Oxide (NO) as the oxidizing gas)), a thermal $SiO_2$ layer grown in $O_2$ atmosphere at 750° C. ($O_2$-RTO), a $Si_3N_4$ layer deposited at 600° C. by 10 seconds of a Radical Assisted Chemical Vapor Deposition (RACVD) process using $SiH_4$ and Nitrogen radicals, and a $Si_3N_4$ layer deposited at 600° C. by 120 seconds of a RACVD process using $SiH_4$ and Nitrogen radicals.

Figure 2:
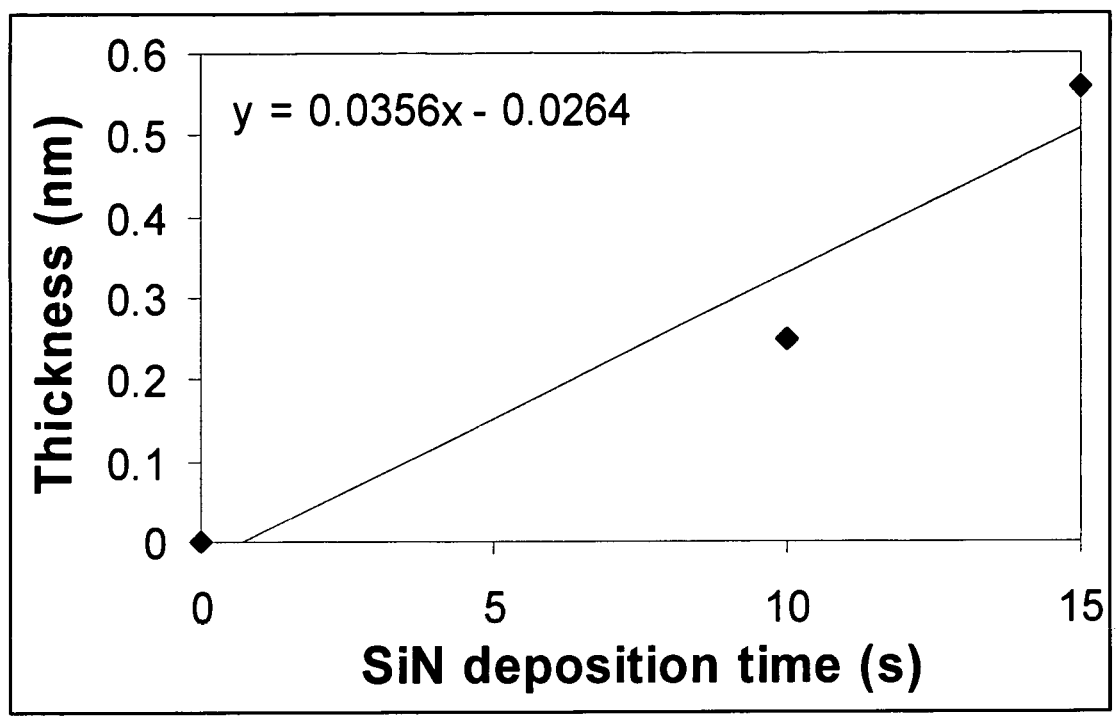

FIG. 2 represents the XPS (X-Ray Photoelectron Spectroscopy) growth curve for $Si_3N_4$ upon a NO-RTO substrate.

Figure 3:
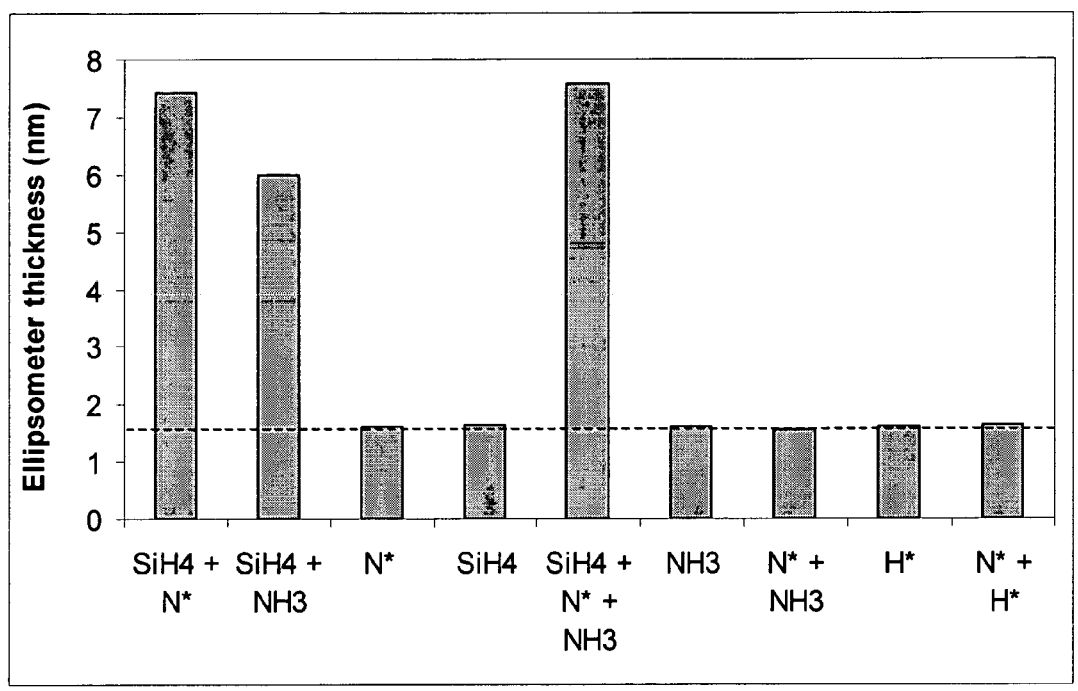

FIG. 3 represents the ellipsometer thickness of different substrate surfaces after their treatment by a RACVD process, a thermal CVD process using different precursors, or thermal or plasma assisted treatments in ammonia, nitrogen or hydrogen.

Figure 4:
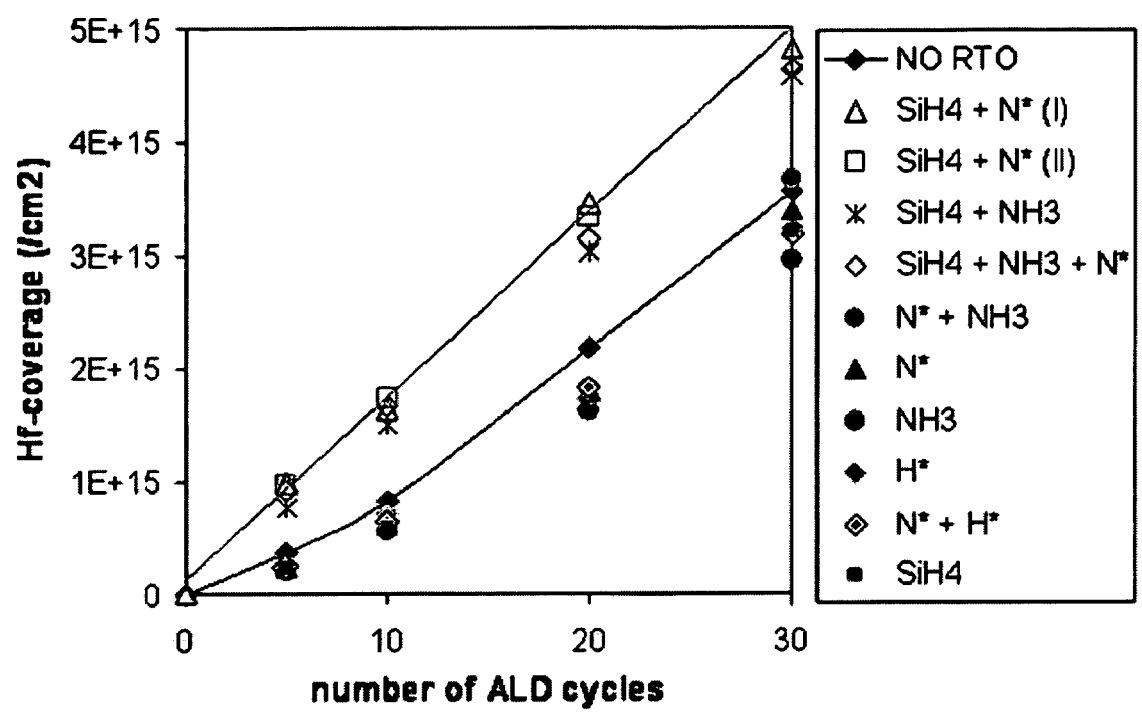

FIG. 4 represents the growth curves of $HfO_2$ upon a NO-RTO SiON layer with or without different treatments of the SiON layer.

Figure 5:
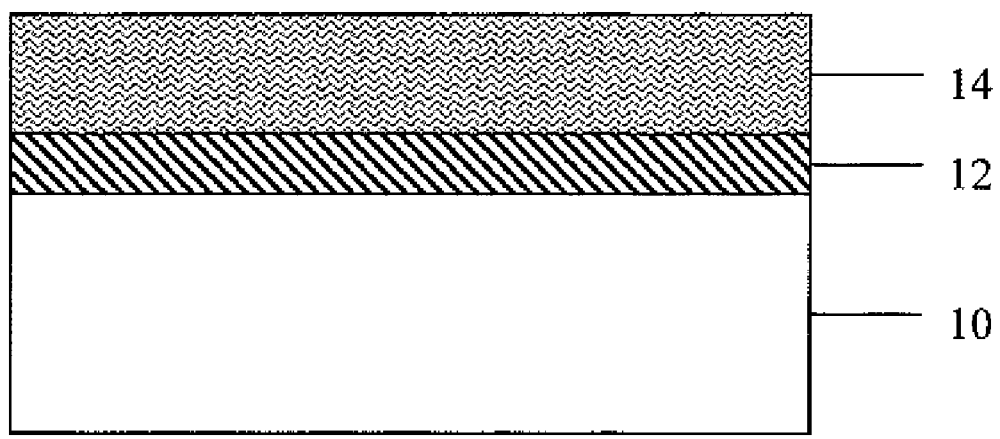

FIG. 5, not to scale, depicts a substrate 10 upon which a $Si_xN_y$ layer 12 is deposited. A metal, metal oxide, metal nitride, metal oxynitride and/or metal carbide layer 14 is deposited upon the $Si_xN_y$ layer 12.

DETAILED DESCRIPTION OF THE PREFERRED EMBODIMENT

The following description and examples illustrate a preferred embodiment of the present invention in detail. Those of skill in the art will recognize that there are numerous variations and modifications of this invention that are encompassed by its scope. Accordingly, the description of a preferred embodiment should not be deemed to limit the scope of the present invention.

The preferred embodiments provide a method for enhancing the growth of a metal, metal oxide, metal nitride, metal oxynitride and/or metal carbide layer comprising the step of depositing the metal, metal oxide, metal nitride, metal oxynitride and/or metal carbide layer upon a $Si_xN_y$, wherein x and y are real numbers, wherein x is equal to about 3 or is higher than about 3, wherein y is higher than 0 and equal to about 4 or less than about 4, and wherein x and y may be equal or different.

Preferably, $x \geq 3$ and $0 < y \leq 4$.

Preferably, the ratio x/y is higher than about 0.75 and may vary with no upper limit, each value higher than (or equal to) 0.75 being encompassed in the scope of the preferred embodiments.

The preferred embodiments also provide a method for treating a (substrate) surface in preparation of a subsequent deposition of a metal, metal oxide, metal nitride, metal oxynitride, and/or metal carbide layer comprising the step of depositing a $Si_xN_y$ layer, wherein x and y are real numbers, wherein x is equal to (about) 3 or is higher than (about) 3, wherein y is higher than 0 and equal to or less than (about) 4, and wherein x and y may be equal or different, upon the (substrate) surface.

The metal, metal oxide, metal nitride, metal oxynitride and/or metal carbide layer is/are deposited directly upon the $Si_xN_y$ layer.

In the context of the preferred embodiments, a $Si_xN_y$ layer, wherein x and y are real numbers, wherein x is equal to (about) 3 or is higher than (about) 3, wherein y is higher than 0 and equal to or less than (about) 4, and wherein x and y may be equal or different, can also be referred to as a "$Si_3N_4$-like layer".

In the context of the preferred embodiments, the surface(s) to be treated is/are any surface(s) used in semiconductor processing on which the metal growth is inhibited (hindered/impeded). The surface(s) can be referred to herein as "chemically stable surface(s)", as "(metal growth) inhibiting surface(s)", or as "difficult surface(s)".

The surface(s) can be any (substantially) stoichiometric material(s), having a very low impurity content, on which inhibited film growth is usually observed. For example, thermal $SiO_2$ and thermal SiON are such surfaces.

Any metal(s) used in semiconductor processing, in particular for fabricating metal gates or for barrier layers, can be used in a method of the preferred embodiments.

The metal(s) can be deposited by a PVD (Physical Vapor Deposition) process such as sputtering, by an ALD (Atomic Layer Deposition) process, by a CVD (Chemical Vapor Deposition) process, by a MOCVD (Metal-Organic Chemical Vapor Deposition) process or by any other suitable processes.

For example, tantalum (Ta), ruthenium (Ru), titanium (Ti), tungsten (W), aluminium (Al), copper (Cu), Cobalt (Co), nickel (Ni), molybdenum (Mo), or any combination of two, three, four, five, six or more thereof, can be used in a method of the preferred embodiments.

The speed of a semiconductor device is directly proportional to the response of a gate dielectric in a field effect transistor (FET) after a voltage is applied. The response of a gate dielectric is directly proportional to its dielectric constant k and inversely proportional to its thickness. Thus, the need for a thin (even ultra-thin) and high k dielectric, depending on the applications, can be highly desirable for a gate dielectric.

Any metal oxide(s) used in semiconductor processing, in particular for fabricating high-k dielectric metal oxide(s) gates, can be used in a method of the preferred embodiments.

The metal oxide(s) can be deposited by a PVD process such as sputtering, by an ALD process, by a CVD process, by a MOCVD process or by any other suitable processes.

For example, metal oxides (with high dielectric constant) that can be used are titanium oxide ($TiO_2$), tantalum pentoxide ($Ta_2O_5$), aluminium oxide ($Al_2O_3$), zirconium oxide ($ZrO_2$), lanthanum oxide ($La_2O_3$), hafnium oxide ($HfO_2$), or various combinations (in the form of multi-layers or multi-components) of two, three, four or more thereof. Further examples are ternary oxides such as metal silicon oxides, e.g. hafnium scandium oxide, in particular hafnium silicon oxide, barium strontium titanate (BST), lead zirconium titanate (PZT) and/or zirconium silicate.

Depending on the thickness of the metal oxide layer to reach, different processes such as PVD, ALD, CVD or MOCVD process can be carried out for depositing the metal oxides upon a $Si_xN_y$ layer.

In a method of the preferred embodiments, the metal oxide material is deposited by an Atomic Layer Deposition (ALD) process.

Any metal nitride(s) used in semiconductor processing, in particular for fabricating metal gates, can be used in a method of the preferred embodiments.

The metal nitride(s) can be deposited by a PVD process such as sputtering, by an ALD process, by a CVD process, by a MOCVD process or by any other suitable processes.

For example, tantalum nitride (TaN), titanium nitride (TiN), tungsten nitride (WN), niobium nitride (NbN), molybdenum nitride (MoN), or any combination of two, three, four, or more thereof, can be used in a method of the preferred embodiments.

Any metal carbide(s) used in semiconductor processing, in particular for fabricating metal gates, can be used in a method of the preferred embodiments.

The metal carbide (s) can be selected from the group consisting of tantalum carbide, titanium carbide, tungsten carbide, niobium carbide, molybdenum carbide, and hafnium carbide. Further, any combination consisting of a metal nitride and a metal carbide can be used such as tungsten nitride carbide.

The metal carbides(s) can be deposited by a PVD process such as sputtering, by an ALD process, by a CVD process, by a MOCVD process or by any other suitable processes.

A method of the preferred embodiments can comprise the step of depositing the $Si_xN_y$ layer upon a surface, in particular upon a metal growth inhibiting surface, such as a silicon oxide layer or a silicon oxynitride layer, before the step of depositing the metal, metal oxide, metal nitride, metal oxynitride, and/or metal carbide layer.

The $Si_xN_y$ layer can be deposited by any suitable process, preferably by a (thermal) Chemical Vapor Deposition (CVD), by a Radical Assisted Chemical Vapor Deposition (RACVD) process or by a (Remote) Plasma Enhanced Chemical Vapor Deposition (RPECVD or PECVD) process.

A (thermal) CVD process for depositing a $Si_xN_y$ layer preferably makes use of precursors comprising at least one silane and ammonia ($NH_3$).

A RACVD, RPECVD or PECVD process for depositing a $Si_xN_y$ layer preferably makes use of precursors comprising at least one silane and nitrogen radicals (N*), and optionally ammonia ($NH_3$).

In a method of the preferred embodiments, the silane(s) can be selected from the group consisting of monosilane ($SiH_4$), disilane ($Si_2H_6$), trisilane ($Si_3H_8$), monochlorosilane, dichlorosilane (DCS), trichlorosilane (TCS) and tetrachlorosilane ($SiCl_4$, also referred to as silicon chloride).

In a preferred method according to the preferred embodiments, a hafnium oxide layer is deposited upon a $Si_3N_4$-like layer.

In conventional methods, in gate stack applications, $HfO_2$ deposited on chemical oxides was found to have clearly better leakage current and thickness scaling properties than $HfO_2$ deposited on thermal oxide.

In parallel, the integration of $HfO_2$ with polysilicon electrodes in the gate stack was found to be problematic when a thermal oxide under-layer was used.

This was correlated with the fact that $HfO_2$ could grow well on chemical oxide and showed a clear growth inhibition on thermal oxide.

However thermally grown under-layers for $HfO_2$ are preferred in gate stack applications because of their better electrical properties, resulting in better carrier mobility in semiconductor devices.

A method according to the preferred embodiments allows the manufacture of a high quality $HfO_2$ film on such thermal oxide under-layers. The thermal oxide under-layers are thus treated before depositing the $HfO_2$ layer, the treatment comprising or consisting of the step of depositing a $Si_xN_y$ layer.

A method of the preferred embodiments comprises thus the step of depositing a $Si_xN_y$ layer upon a metal growth inhibiting surface, contiguously followed by the step of depositing a $HfO_2$ layer upon the $Si_xN_y$ layer.

The minimal thickness of the $Si_xN_y$ layer is about 0.25 nm, corresponding with a coverage of the metal growth inhibiting surface with about one molecular layer of $Si_xN_y$.

In a method of the preferred embodiments, the hafnium oxide layer is deposited by ALD process, which is commonly used for depositing films in the nanometer(s) thickness range.

The deposition is preferably performed at a temperature comprised between (about) 200° C. and (about) 500° C., preferably between (about) 250° C. and (about) 400°, more preferably at (about) 300° C., with precursors comprising or consisting of $HfCl_4$ and $H_2O$.

The pressure in the reactor can be comprised between (about) 0.1 and (about) 10 torrs (i.e. between (about) 0.0001333224 bar and (about) 0.01333224 bar), and is preferably (about) 1 Torr (i.e. (about) 0.001333224 bar).

Figure 1:
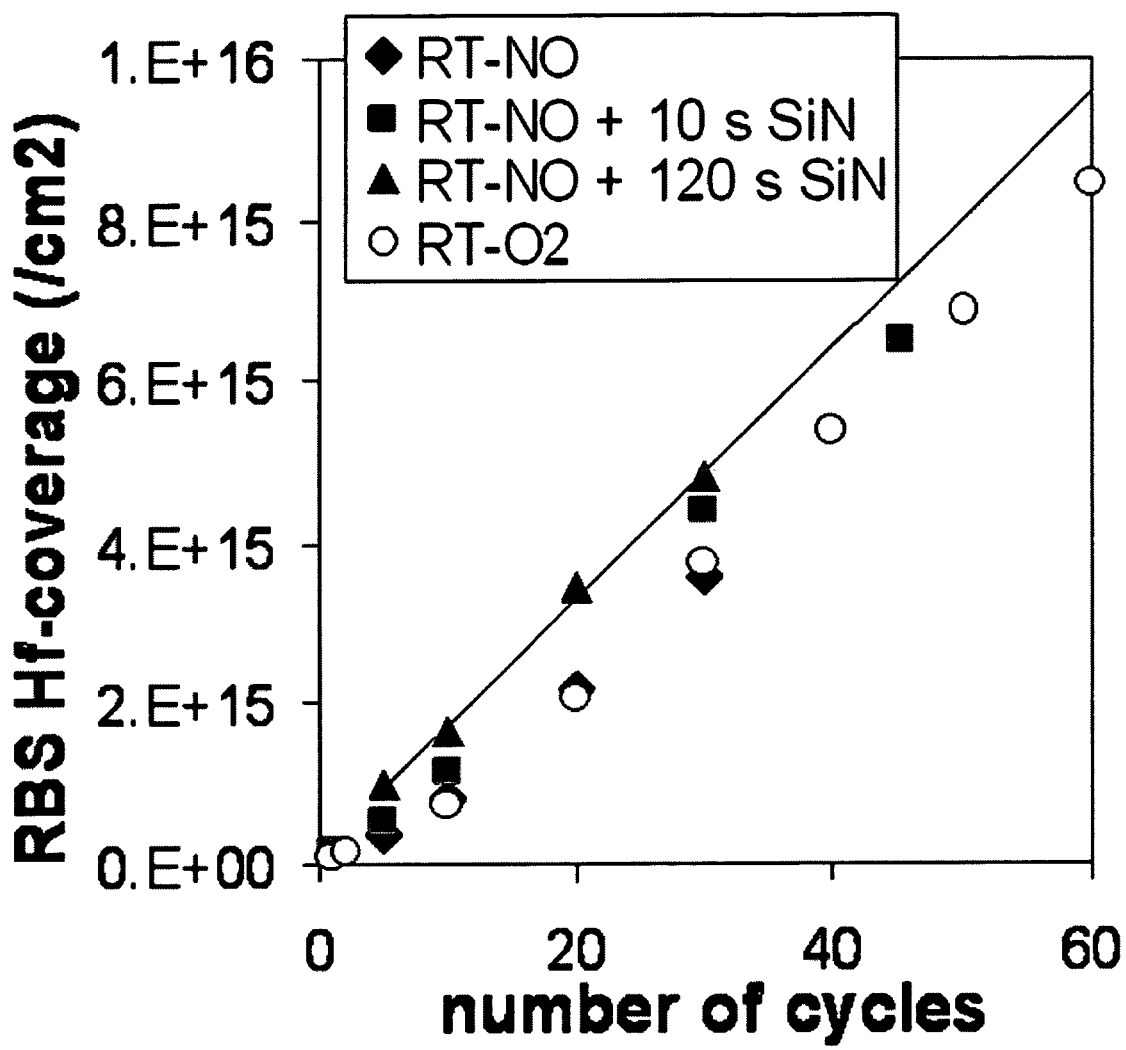
FIG. 1 represents the growth curves of $HfO_2$ upon different substrate surfaces.

As shown in FIG. 1, the $HfO_2$ growth enhancement depends on the $Si_3N_4$-like deposition time, in other words, depends on the thickness of the $Si_3N_4$-like layer.

For example, a $Si_3N_4$-like layer having a thickness of about 4 nm results in optimal $HfO_2$ growth properties. Nevertheless, a $Si_3N_4$-like layer thickness of about 0.25 nm is already sufficient for generating a significant enhancement of the $HfO_2$ layer growth.

In the meantime, for successful application of the surface treatment in a gate stack, it is important that the $Si_3N_4$-like layer deposited on the difficult surface does not result in an unacceptable increase of the electrical thickness (also referred to as Equivalent Oxide Thickness (EOT)) of the gate stack.

XPS analysis (FIG. 2) showed that the amount of material deposited after 10 seconds corresponds to a deposited $Si_3N_4$-like film thickness of about 0.25 nm. Such a thickness results in an increase in the EOT (Equivalent Oxide Thickness) of only about 0.12 nm. Thus a significant growth improvement can be achieved with a minor increase in the electrical thickness. Slightly longer treatments of about 15 seconds or about 20 seconds should result respectively in a $Si_3N_4$-like film thickness of about 0.5 nm and about 0.7 nm, increasing the electrical thickness (EOT) within acceptable limits to reach about 0.18 nm to about 0.24 nm.

For similar reasons, the $HfO_2$ layer thickness is preferably less than 8 nm, preferably less than (about) 7 nm, more preferably less than (about) 5 nm, (about) 4 nm or (about) 3 nm, and even more preferably less than (about) 2 nm.

The $Si_3N_4$-like layer is deposited upon a (thermal) silicon oxynitride layer, but can also be deposited upon a (thermal) silicon oxide layer.

Different methods can be used for depositing the $Si_3N_4$-like layer.

For depositing the $Si_3N_4$-like layer a RACVD process can be performed, using precursors comprising or consisting of at least one silane, preferably $SiH_4$, with nitrogen radicals and optionally $NH_3$.

The nitrogen radicals are preferably generated in a Radical Generator which is located adjacent to the reaction chamber. A suitable radical Generator is a Microwave Radical Generator (MRG).

Alternatively, a PECVD process can be used wherein both the silicon precursor and the nitrogen precursor are activated by plasma. The plasma can be located in the reaction chamber or it can be remote.

Another method for depositing the $Si_3N_4$-like layer can be a thermally activated CVD process, wherein the precursors consist of at least one silane, preferably $SiH_4$, and $NH_3$.

For any of the processes carried out, the $Si_3N_4$-like layer is preferably deposited at a temperature comprised between (about) 400° C. and (about) 800° C., more preferably at a temperature comprised between (about) 500° C. and (about) 700° C., and in particular at a temperature of (about) 600° C.

As illustrated by FIG. 1, deposition of only 10 seconds of $Si_3N_4$-like layer by a RACVD process (corresponding to about 0.25 nm apparent thickness by XPS measurement) results in a significant reduction of $HfO_2$ growth inhibition.

And depositing a larger amount of $Si_3N_4$-like (thickness of about 4 nm) result in complete elimination of the $HfO_2$ growth inhibition, as illustrated by FIG. 4.

Indeed, FIG. 4 shows that when NO-RTO grown SiON layers (RTO in NO gas at 1000° C.) are treated first with a $SiH_4/N^*$ based Radical Assisted CVD process at 600° C., growth inhibition of $HfO_2$ is strongly reduced or even completely eliminated.

In fact, the mere observation of the growth curves of FIG. 4 (with the coverage of the deposited layer as a function of the number of ALD reaction cycles) gives a first indication of the effect of the substrate.

Linear growth curves (constant growth rate) are generally associated with good film morphology and fast layer closure.

Growth inhibition (a lower growth rate in the first reaction cycles) indicates the difficult nucleation of the precursors on the substrate and point to island growth, low film quality and late layer closure.

Many other surface treatments of NO-RTO thermally grown SiON tested in the same experiment, such as anneals of the SiON in $NH_3$, $N^*$, $H^*$, $N^*/H^*$, $N^*/NH_3$ or $SiH_4$, are not successful in eliminating growth inhibition.

Surface treatments with a $SiH_4/NH_3$ CVD process and a $SiH_4/N^*$ or $SiH_4/N^*/NH_3$ RACVD process are all able to eliminate growth inhibition on the chemically very stable thermally grown SiON surface.

In view of the results obtained by a method of the preferred embodiments, it can be inferred that the deposition of the first few Angstroms of $HfO_2$ start uniformly everywhere on the surface so that immediately a nice closed monolayer of atoms is formed in the first stages of the deposition, and the film growth continues in a uniform way.

Another aspect of the preferred embodiments relates to a high-k gate stack obtainable by a method of the preferred embodiments.

A high-k gate stack of the preferred embodiments can be a stack of layers comprising a growth inhibiting surface, in particular a thermal $SiO_2$ or a thermal SiON surface, upon which a $Si_3N_4$-like layer is deposited, upon which a high-k metal oxide (closed) film is deposited. The high-k metal oxide closed film has a thickness of less than 8 nm, preferably less than (about) 7 nm, more preferably less than (about) 5 nm, less than (about) 4 nm or less than (about) 3 nm, and even more preferably of less than (about) 2 nm.

A high-k gate stack of the preferred embodiments can also be a stack of layers comprising a growth inhibiting high-k dielectric surface, upon which a $Si_3N_4$-like layer is deposited, upon which a metal and/or metal nitride (closed) film is deposited as gate electrode. In this case, the high-k gate layer is growth inhibiting and the nitride-like layer is enhancing the growth of the metal or metal nitride gate electrode.

The preferred embodiments are described in further details in the following examples, which are intended for illustration purposes only, and should not be construed as limiting the scope of the preferred embodiments in any way.

EXAMPLES

In a first step, the silicon (Si) substrate is cleaned by hydrofluoric acid (HF) dip.

Upon the silicon substrate, a thermal SiON layer is grown By Rapid Thermal Oxidation in Nitric Oxide (NO) atmosphere at 1000° C. (NO-RTO).

$Si_3N_4$-like layers are then deposited at 600° C. by means of Radical Assisted Chemical Vapor Deposition (RACVD) from $SiH_4$ and Nitrogen radicals and optionally $NH_3$ precursors, or by means of a thermally activated CVD process, using $SiH_4$ together with $NH_3$ precursors.

In order to have comparable results, and since the deposition rate of the CVD process is different from the deposition rate of the RACVD process used in the exemplary processes of table 1, the deposition time is chosen such that the thickness of the $Si_3N_4$ layer is between about 4 nm and about 5 nm.

Other treatments at 600° C. of the NO-RTO SiON layer are also considered.

All process parameters are described in table 1.

All thermal treatments are performed in a nitride CVD reactor, integrated on a Polygon® 8200 platform.

Radicals are generated with a Microwave Radical Generator (MRG).

Upon the different surfaces, with or without the treatments that are summarized in table 1, $HfO_2$ is deposited in an ASM ALCVD™ Pulsar® 2000 reactor, also integrated on the Polygon® platform.

All $HfO_2$ depositions are performed at 300° C. with $HfCl_4$ and $H_2O$ precursors.

The pressure in the reactor is 1 Torr (i.e. 0.001333224 bar). The cycle numbers range between 1 and 100.

Uniform film thickness and low sensitivity towards pulse and purge times indicated that surface saturation is obtained and ALD conditions prevail.

See Table 1.

TABLE 1

| Process | Reactants | $N_2$ slm | $SiH_4$ sccm | $NH_3$ (slm) | $H_2$ slm | MRG gas | p Torr | T ° C. | DepRate nm/min | $SiH_4$pp Torr | $NH_3$pp Torr |
|---|---|---|---|---|---|---|---|---|---|---|---|
| RACVD | SiH4 + N* | 16 | 50 | 0 | 0 | N2 | 2.5 | 600 | 2.90 | 0.01 | 0.00 |
| CVD | SiH4 + NH3 | 5 | 40 | 2 | 0 | — | 55 | 600 | 1.20 | 0.31 | 15.71 |
| RAN | N* | 16 | 0 | 0 | 0 | N2 | 2.5 | 600 | 0.00 | 0.00 | 0.00 |
| CVD | SiH4 | 0 | 50 | 0 | 0 | — | 2.5 | 600 | 0.00 | 2.50 | 0.00 |
| RACVD | SiH4 + N* + NH3 | 21 | 50 | 0.2 | 0 | N2 | 2.5 | 600 | 10.21 | 0.01 | 0.02 |
| RTN | NH3 | 5 | 0 | 2 | 0 | — | 55 | 600 | 0.00 | 0.00 | 15.71 |
| RAN/RTN | N* + NH3 | 21 | 0 | 0.2 | 0 | N2 | 2.5 | 600 | 0.00 | 0.00 | 0.02 |
| RAA | H* | 0 | 0 | 0 | 16 | H2 | 2.5 | 600 | 0.00 | 0.00 | 0.00 |
| RAN/RAA | N* + H* | 11 | 0 | 0 | 5 | N2 + H2 | 2.5 | 600 | 0.00 | 0.00 | 0.00 |

The terms used in table 1 are:
RACVD: Radical Assisted Chemical Vapor Deposition
CVD: Chemical Vapor Deposition
RAN: Radical Assisted Nitridation
RTN: Raid Thermal Nitridation
RAA: Radical Assisted Annealing The $HfO_2$ growth characteristics for the NO-RTO SiON substrate and NO-RTO SiON/$Si_3N_4$-like substrates are shown in FIG. 1.

For NO-RTO SiON substrates, growth inhibition occurs in the first 30 ALD reaction cycles. Such growth inhibition effects of $HfO_2$ are typical for NO-RTO substrates. They are also observed for $O_2$-RTO substrates (FIG. 1). They typically point to island growth.

Depositing a RACVD $Si_3N_4$-like layer on the NO-RTO SiON substrate improves the $HfO_2$ nucleation, as shown in FIG. 1 by a growth curve that shows no little or no sign of growth inhibition anymore.

It is also clear from FIG. 1 that the $HfO_2$ growth enhancement depends on the $Si_3N_4$-like layer deposition time, and thus on the thickness of the $Si_3N_4$-like layer.

120 seconds $Si_3N_4$-like deposition results in a linear $HfO_2$ growth curve, being similar to the one observed for ALD of $HfO_2$ on a 1 nm Si chemical oxide. A chemical oxide comprises many —OH groups, which are easy sites for nucleation and, consequently, such an oxide is not inflicted with growth inhibition. Unfortunately, such a chemical oxide is electrically of poor quality so that it can not be used in a semiconductor device structure.

Such linear growth curves are associated with two-dimensional growth behavior and good $HfO_2$ film quality.

The XPS $Si_3N_4$-like deposition rate at 600° C. is 2.1 nm/minute. Thus, 120 seconds of $Si_3N_4$-like deposition corresponds to a $Si_3N_4$-like layer thickness of 4.3 nm and results in optimal $HfO_2$ growth properties.

For 10 seconds of $Si_3N_4$-like deposition, a significant enhancement in $HfO_2$ growth rate is observed in the first cycles, although to a smaller extent than for 120 s.

The fact that a 10 seconds $Si_3N_4$-like layer deposition already results in an improvement of the $HfO_2$ growth behavior is very interesting for gate stack applications.

For gate stack applications targeting a minimal EOT (Equivalent Oxide Thickness), the $Si_3N_4$-like layer thickness should be minimal. 10 seconds $Si_3N_4$-like layer deposition gives a thickness of about 0.25 nm $Si_3N_4$-like according to XPS (FIG. 2), corresponding to only about 0.12 nm EOT. Thus, a $HfO_2$ growth improvement can already be achieved with a minor EOT contribution.

Having regard to the treatments of the NO-RTO surfaces with respectively N*, $SiH_4$, $NH_3$, N*+$NH_3$, H*, and N*+H*, no $Si_3N_4$-like deposition is observed as illustrated by FIG. 3.

Ellipsometer results (FIG. 3) indicate that only three of the considered processes (treatments) result in the actual deposition of a $Si_3N_4$-like layer: the combination of $SiH_4$ and N* (by the RACVD process), the combination of SiH4, N* and $NH_3$ (by the RACVD process), and the combination of $SiH_4$ and $NH_3$ (by the (thermal) CVD process).

In those cases, the ellipsometer thickness measured is about 4 nm to about 5 nm thicker than that of the NO-RTO starting layer (having a thickness of about 1.7 nm).

The $HfO_2$ growth curves on the different substrates are shown in FIG. 4.

A growth improvement is observed only when a $Si_3N_4$-like layer is deposited on the NO-RTO substrate.

The layers obtained by RACVD process using $SiH_4$, N* and optionally $NH_3$ precursors and by CVD process using $SiH_4$ and $NH_3$ precursors, induce the growth improvement.

Other treatments that do not deposit a $Si_3N_4$-like layer do not result in an improvement in the $HfO_2$ growth behaviour.

These data suggest that these treatments in $SiH_4$/N* or $SiH_4$/$NH_3$ or $SiH_4$/N*/$NH_3$ leave behind a surface that is favorable for $HfO_2$ growth initiation.

None of the other treatments were able to achieve this on thermal oxide.

The invented treatments, in contrary to the other treatments, do deposit some silicon-nitride-like material on the thermal oxide and apparently leave behind chemical groups (possibly —NH) that are favorable for reaction with the $HfCl_4$/$H_2O$ precursors of the $HfO_2$ deposition process.

Moreover, the silicon-nitride-like material that is deposited on the difficult surface is fully compatible with application of the films as gate dielectric.

In conclusion, the growth of $HfO_2$ on $Si_3N_4$-like substrates, the latter deposited on thermal SiON(NO-RTO) substrates, is substantially improved.

Both thermal and Radical Assisted CVD $Si_3N_4$-like layers, deposited at 600° C., are good starting substrates for $HfO_2$ ALD.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method for increasing a layer growth rate of a material, the method comprising:
depositing a $Si_xN_y$ layer atop a substrate, wherein the substrate is $SiO_2$ formed by a rapid thermal oxidation process in $O_2$, by a method using as precursors at least one silane and at least one member of the group consisting of a nitrogen radical and ammonia, wherein the method is selected from the group consisting of radical assisted chemical vapor deposition, plasma enhanced chemical vapor deposition, and remote plasma enhanced chemical vapor deposition, wherein x is greater than or equal to about 3, and wherein y is greater than 0 and less than or equal to about 4, wherein the substrate is a substantially stoichiometric material having a very low impurity content on which inhibited film growth is observed, and wherein an electrical thickness of the $Si_xN_y$ layer is no greater than 0.24 nm; and depositing a material upon the $Si_xN_y$ layer, wherein the material is selected from the group consisting of a metal, a metal oxide, a metal nitride, a metal oxynitride, a metal carbide, and combinations thereof, and wherein a layer growth rate of the material on the $Si_xN_y$ layer is higher than a layer growth rate of the material on the substrate.

2. The method according to claim 1, wherein the metal oxide is selected from the group consisting of titanium oxide, tantalum oxide, aluminium oxide, zirconium oxide, lanthanum oxide, hafnium oxide, hafnium scandium oxide, hafnium silicon oxide, and combinations thereof.

3. The method according to claim 1, wherein the $Si_xN_y$ layer is deposited using ammonia.

4. The method according to claim 1, wherein the $Si_xN_y$ layer is deposited using at least one silane and ammonia, wherein the silane is selected from the group consisting of monosilane, disilane, trisilane, monochlorosilane, dichlorosilane, trichlorosilane, and tetrachlorosilane.

5. The method according to claim 1, wherein the $Si_xN_y$ layer is deposited using at least one silane and at least one nitrogen radical.

6. The method according to claim 1, wherein the $Si_xN_y$ layer is deposited at least one silane selected from the group consisting of monosilane, disilane, trisilane, monochlorosilane, dichlorosilane, trichlorosilane, and tetrachlorosilane, and at least one nitrogen radical.

7. A method for manufacturing a high-k gate stack comprising the method according to claim 1.

8. A method for manufacturing an integrated circuit comprising the method according to claim 1.

9. The method according to claim 1, wherein a physical thickness of the $Si_xN_y$ layer is about 0.25 nm.

10. The method according to claim 1, wherein a physical thickness of the $Si_xN_y$ layer is about 0.5 nm.

11. The method according to claim 1, wherein the precursors further comprise ammonia.

12. The method according to claim 1, wherein the material is deposited by atomic layer deposition.

13. The method according to claim 1, wherein the $Si_xN_y$ layer is deposited using at least one nitrogen radical and ammonia.

14. The method according to claim 1, wherein the material is a metal oxide selected from the group consisting of titanium oxide, tantalum oxide, aluminium oxide, zirconium oxide, lanthanum oxide, hafnium oxide, hafnium scandium oxide, hafnium silicon oxide, and combinations thereof.

15. The method according to claim 1, wherein the material is $HfO_2$.

16. The method according to claim 1, wherein a physical thickness of the $Si_xN_y$ layer is about 0.7 nm.

17. The method according to claim 1, wherein the material is a high-k metal oxide closed film having a thickness of less than 8 nm.

18. The method according to claim 1, wherein the material is a high-k metal oxide closed film having a thickness of less than 2 nm.

19. The method according to claim 1, wherein the $Si_xN_y$ layer has an equivalent oxide thickness of about 0.12 nm.

20. The method according to claim 1, wherein the $Si_xN_y$ layer has an electrical thickness of from about 0.18 nm to about 0.24 nm.

21. A method for increasing a layer growth rate of a material, the method comprising:

forming a substrate by a rapid thermal oxidation process in $O_2$, wherein the substrate is $SiO_2$, and wherein the substrate has a very low impurity content on which inhibited film growth is observed;

depositing a $Si_xN_y$ layer upon the substrate by a method selected from the group consisting of radical assisted chemical vapor deposition, remote plasma enhanced chemical vapor deposition, and plasma enhanced chemical vapor deposition, using precursors comprising at least one silane and nitrogen radical, wherein x is greater than or equal to about 3, and wherein y is greater than 0 and less than or equal to about 4, and wherein an electrical thickness of the $Si_xN_y$ layer is no greater than 0.24 nm; and depositing a material upon the $Si_xN_y$ layer, wherein the material is selected from the group consisting of a metal, a metal oxide, a metal nitride, a metal oxynitride, a metal carbide, and combinations thereof, and wherein a layer growth rate of the material on the $Si_xN_y$ layer is higher than a layer growth rate of the material on the substrate.

22. The method according to claim 21, wherein the step of depositing the $Si_xN_y$ layer comprises treatment of the substrate for the subsequent deposition of the material.

23. The method of claim 21, wherein the $Si_xN_y$ layer is deposited by radical assisted chemical vapor deposition.

24. The method according to claim 21, wherein a physical thickness of the $Si_xN_y$ layer is about 0.25 nm.

25. The method according to claim 21, wherein a physical thickness of the $Si_xN_y$ layer is about 0.5 nm.

26. The method according to claim 21, wherein a physical thickness of the $Si_xN_y$ layer is about 0.7 nm.

27. The method according to claim 26, wherein the material is a metal oxide selected from the group consisting of titanium oxide, tantalum oxide, aluminium oxide, zirconium oxide, lanthanum oxide, hafnium oxide, 41 scandium oxide, hafnium silicon oxide, and combinations thereof.

28. The method according to claim 27, wherein the material is $HfO_2$.

29. The method according to claim 28, wherein the $HfO_2$ is deposited at 300° C. from $HfCl_4$ and $H_2O$ precursors at a reactor pressure of 1 Torr.

30. The method according to claim 21, wherein the material is a high-k metal oxide closed film having a thickness of less than 8 nm.

31. The method according to claim 21, wherein the material is a high-k metal oxide closed film having a thickness of less than 2 nm.

32. The method according to claim 21, wherein the $Si_xN_y$ layer has an equivalent oxide thickness of about 0.12 nm.

33. The method according to claim 21, wherein the $Si_xN_y$ layer has an electrical thickness of from about 0.18 nm to about 0.24 nm.

34. The method according to claim 21, wherein the material is deposited by atomic layer deposition.

* * * * *